(12) United States Patent
Schmitt

(10) Patent No.: US 7,214,930 B2
(45) Date of Patent: May 8, 2007

(54) PULSE GENERATOR

(75) Inventor: Peter Schmitt, Würzburg (DE)

(73) Assignee: KBA-Metronic AG, Veitschocheim (DE)

( * ) Notice: Subject to any disclaimer, the term of this patent is extended or adjusted under 35 U.S.C. 154(b) by 170 days.

(21) Appl. No.: 10/976,339

(22) Filed: Oct. 28, 2004

(65) Prior Publication Data

US 2005/0092906 A1 May 5, 2005

(30) Foreign Application Priority Data

Nov. 3, 2003 (DE) ............................... 103 51 560

(51) Int. Cl.
*G01D 5/34* (2006.01)
*G01D 5/36* (2006.01)
*H03M 1/22* (2006.01)

(52) U.S. Cl. ..................... 250/231.13; 250/237 G; 341/13

(58) Field of Classification Search ........... 250/231.13, 250/237 G; 341/13
See application file for complete search history.

(56) References Cited

U.S. PATENT DOCUMENTS

| 3,364,359 A | 1/1968 | Cronin |
| 3,482,106 A | 12/1969 | Anderegg, Jr. et al. |
| 4,529,964 A | 7/1985 | Minami et al. |
| 4,647,769 A | 3/1987 | Stone |
| 4,785,181 A | 11/1988 | Kimizuka et al. |
| 5,216,257 A | 6/1993 | Brueck et al. |
| 5,537,210 A * | 7/1996 | Kaneda et al. .............. 356/499 |
| 5,644,514 A | 7/1997 | Abo et al. |
| 5,663,794 A * | 9/1997 | Ishizuka ..................... 356/499 |
| 6,580,066 B2 * | 6/2003 | Uehira et al. ........... 250/237 G |
| 6,635,863 B1 * | 10/2003 | Nihommori et al. ... 250/231.13 |
| 2004/0118999 A1 * | 6/2004 | Horton .................. 250/231.13 |

FOREIGN PATENT DOCUMENTS

| DE | 38 36 703 | 7/2006 |
| DE | 100 13 813 | 7/2006 |
| DE | 101 39 796 | 7/2006 |
| EP | 0 297 482 | 7/2006 |
| EP | 0 694 764 | 7/2006 |
| EP | 0 727 646 | 7/2006 |
| EP | 0 985 133 | 7/2006 |
| EP | 0 990 870 | 7/2006 |
| EP | 1 106 972 | 7/2006 |
| EP | 1 154 242 | 7/2006 |
| EP | 1 435 510 | 7/2006 |
| GB | 928564 | 7/2006 |
| JP | 2000088606 | 7/2006 |

* cited by examiner

*Primary Examiner*—Georgia Epps
*Assistant Examiner*—Kevin Wyatt
(74) *Attorney, Agent, or Firm*—Andrew Wilford

(57) ABSTRACT

A pulse generator which can be used for a printer, for example an ink jet printer, to provide adjustable pulses per unit displacement or speed has a linearly or rotatably displaceable first plate with a periodic pattern of different optical density or transmissivity or reflectivity juxtaposed with a second plate with another array of markings of different optical density transmissivity or reflectivity so that in an overlapping region a Moiré pattern or other interference pattern for beat pattern is provided. The latter is detected by an optical sensor which outputs electrical pulses. The two plates can be relatively displaced to change the pattern and hence the detected periodicity.

14 Claims, 6 Drawing Sheets

PULSE GENERATOR

FIELD OF THE INVENTION

My present invention relates to a pulse generator and, more particularly, to an optical pulse generator of the type in which an optical sensor detects a pattern of varying optical characteristics and produces an electrical signal corresponding to the detection of the regions of different optical characteristics to produce, for example, a train of electrical pulses which can represent a displacement of the optical pattern relative to the sensor or of the sensor with respect to the optical pattern. More particularly, the invention relates to a pulse generator comprising at least one movable pulse generating plate with a periodic repetition of regions of different optical characteristics, especially optical density or transparency (light transmissivity) detectable by at least one optical sensor generating an electrical signal with a pattern determined by the detection of the periodic region on the movable pulse generator plate.

BACKGROUND OF THE INVENTION

Pulse generators which have a movable pattern of periodically repeating regions of different optical density or transparency and an optical sensor in the form of an opto-electrical transducer for detecting that pattern as the pulse generating plate is moved and producing an electrical output in the form of a pulse train can also be known as encoders and can output a certain number of pulses per rotation or a certain number of pulses for a given linear displacement. Such encoders can provide inputs to electronic circuitry for calculating and displaying a position of a rotary member or of a linearly displaceable member.

The pulse generating plate will usually have a given periodicity of the repeating regions of different optical density or transparency and the sensor may be a light curtain, photocell or the like capable of detecting reflected light from the pattern on the movable plate or transmitted light traversing the plate to output the electrical signals which can be for example a succession of high and low voltages. The electrical signal or a component thereof, for example its frequency, amplitude or number of rising or falling flanks represents a measurement of the speed of the moving plate or the extent of movement and optionally the direction of movement.

Such pulse generators or encoders can be used in many machines, for example as rotary encoders, to provide a certain number of pulses per revolution of a machine part at its electrical output. The encoder can be used to signal the speed of the machine part or a motor to enable electronic control, for example, of the motor or of the position of the machine part. Commercially such pulse generators generally have a fixed number of pulses per revolution and in the metric system can provide 1000 pulses per revolution or 5000 pulses per revolution, etc.

Especially simple pulse generators of this type are used in computer mouses. Higher precision pulse generators, especially linear pulse generators are widely used in office printers and especially in ink jet printing machines.

Upon incorporation of such pulse generators in a drive with a fixed output per revolution of the pulse generator may require electronic circuitry to convert the pulse output to the requirements of, for example, a printing machine which may use 300 dots per inch, 600 dots per inch or the like which may not be fully compatible with the metric pulse number per revolution or unit of linear movement described above.

Where there are already pulse generators which deviate from the metric units and allow a resolution in terms of dots per inch, they are relatively expensive to make. The circuitry for conversion usually requires operations such as multiplication and division, generally in a multiplicity of cycles and that can cause deviations in the result of several percent. Problems are encountered when it is not possible to carry out correction with an algorithm which can be practiced with available electronic circuitry.

In the printing field especially, print resolutions are usually given in terms of dots per inch and hence inch measurements are required for positioning the printing head so that optimum and distortion-free printing results can be obtained in each printing pass and direction. When pulse generators of the type described at the outset have been used in the past, the print resolution has been less than satisfactory, distortion and optically visible problems, especially with multicolor printing have arisen.

OBJECTS OF THE INVENTION

It is, therefore, the principal object of the present invention to provide a pulse generator which can simply be set to an optional number of pulses per unit, for example per revolution or per unit of longitudinal displacement. However, it should be possible with such a unit to allow nonintegral and irrational numbers of pulses per unit to be produced.

A further object of this invention is to provide a pulse generator which can be used with special advantage in printing machinery and especially ink jet printers or wherever a dots per inch resolution is desirable.

Yet another object is to provide an improved method of generating electrical pulses, especially for the purposes described.

It is yet another object of this invention to provide a pulse generator which is free from drawbacks of prior art pulse generators operating with fixed patterns of periodic regions of optical density, reflectivity and transmissivity.

SUMMARY OF THE INVENTION

These objects are attained, in accordance with the present invention by providing the regions of different optical density, reflectivity or transmissivity of a first pulse generator plate with a first periodicity and juxtaposing therewith a second pulse generator plate with regions of different optical density, reflectivity or transmissivity so that, in a superimposition region, there are formed optical interference patterns or the like with different optical density, reflectivity or transmissivity with at least one-third periodicity whereby the third periodicity is adjustable.

More particularly, a pulse generator according to the invention comprises:

a first plate having regions of periodically different optical characteristics with a first periodicity (P1);

a second plate having regions of periodically different optical characteristics with a second periodicity (P2) juxtaposed with the first plate so that at least in a superimposition zone of the regions with the first and second periodicity, a region is formed with periodically different optical characteristics of a third periodicity (P3) by the regions of the first and second periodicities; and an optical sensor positioned to detect the periodically different optical characteristics of the third periodicity and to generate an electric signal corresponding to the detected periodically different optical characteristics of the third periodicity.

The term "optical characteristics" as here used are intended to refer to optical density, reflectivity and transmissivity. The invention also comprises a printer or printing machine having at last one movable element, for example an ink jet head, having a pulse generator of the type described for determining the position of that movable element. The invention also comprises a method of operating a pulse generator which comprises the steps of:

juxtaposing a first plate having regions of periodically different optical characteristics with a first periodicity (P1) with a second plate having regions of periodically different optical characteristics with a second periodicity (P2) juxtaposed with the first plate so that at least in a superimposition zone of the regions with the first and second periodicity, a region is formed with periodically different optical characteristics of a third periodicity (P3) by the regions of the first and second periodicities; and training an optical sensor to detect the periodically different optical characteristics of the third periodicity and to generate an electric signal corresponding to the detected periodically different optical characteristics of the third periodicity.

According to a preferred feature of the invention, the superimposition of the plates is so carried out that the plates are so disposed that they overlap in the superimposition zone so that a superimposition of the patterns of the first and second periodicity forms a Moiré pattern with at least one third periodicity detectable by at least one optical sensor.

The third periodicity can be varied by relatively displacing the first and second plates of different kinds of patterns and the juxtaposition region can be obtained with different orientations of the two plates with respect to one another.

The pulse generator can be adjusted by a mechanical device, for example, a micrometer screw or electric motor or manually to provide any desired number of pulses per unit of rotation or longitudinal displacement with a high precision and, for example, a variable dots per inch count with minimum deviation from a setpoint value. The first pulse generator plate can be linearly or rotatably displaced while the second pulse generator plate can be fixed in position after adjustment and thus relative both to the second plate and to an optical sensor.

A linear movement can be provided for the first plate and the second plate can have an adjustable angle relative to the first. The first plate can have lines or the like at a constant spacing parallel to one another generally transverse to the linear direction of displacement and the second plate likewise can have straight or curved lines parallel to one another at a constant spacing.

The rotatable plate can have radial or curved lines or patterns which are parallel, equidistant and thus of a constant spacing as well. The plates may be composed of transparent or reflective carrier material and the lines formed thereon may be engraved, imprinted or otherwise formed to provide the different optical density, reflectivity or transmissivity.

Black lines, for example, which are opaque, can be applied to a reflective or transmissive plate.

The superimposition of the pattern and the Moiré pattern which results may represent beats between two closely related frequencies of the first and second plates as defined by their periodicities and the beat may be a result of summation or difference, giving rise to different Moiré patterns in the different directions. However, the periodicities of the first and second plates can be identical with the beats resulting from the angular offsetting of one of the plates relative to the other, the angular displacement determining the effective periodicity of the pulse generator.

BRIEF DESCRIPTION OF THE DRAWING

The above and other objects, features, and advantages will become more readily apparent from the following description, reference being made to the accompanying drawing in which.

SPECIFIC DESCRIPTION

Figure 6:
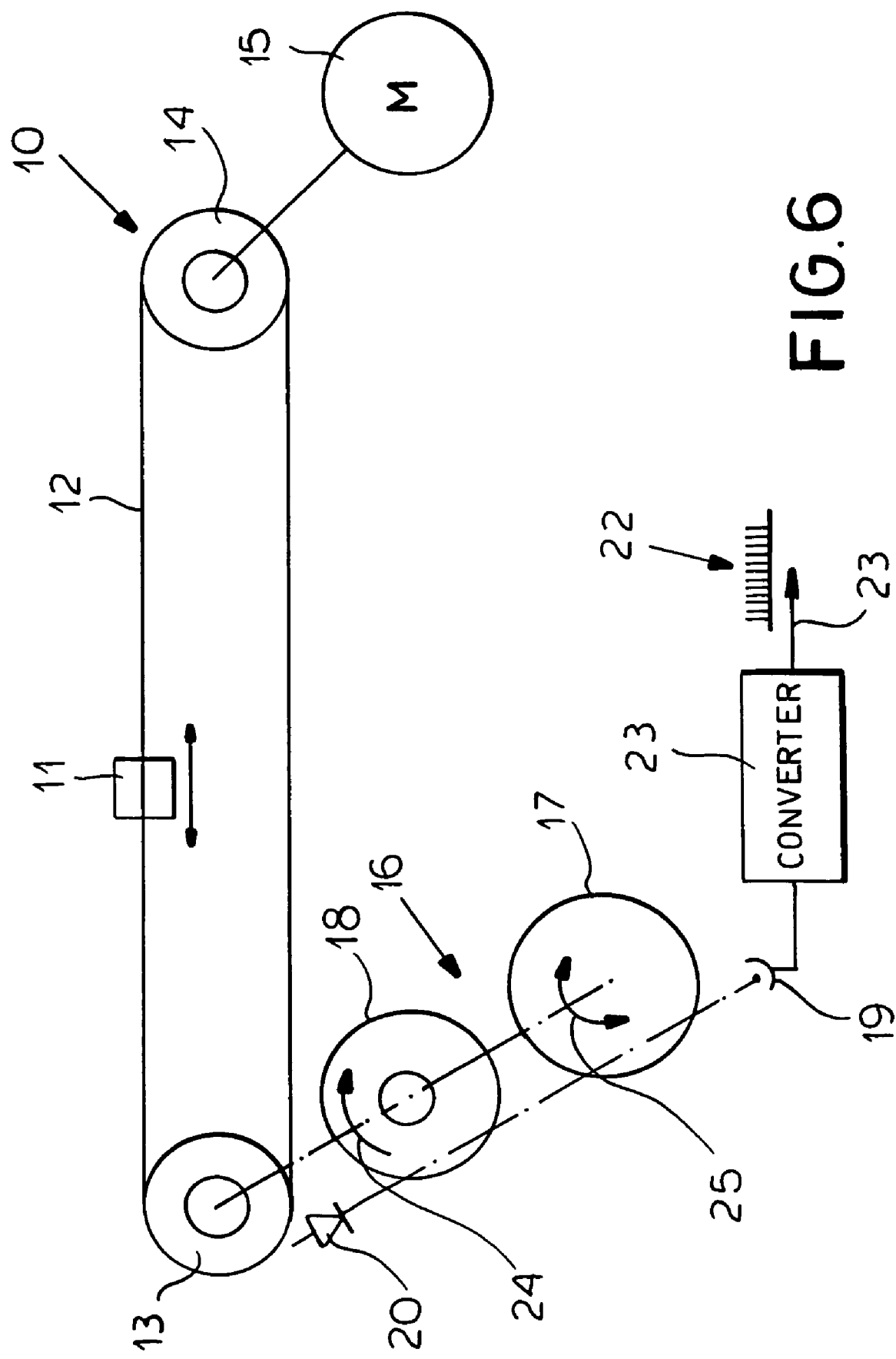
FIG. 6 is a diagram illustrating possible applications of the pulse generators of the invention.

Referring first to FIG. 6, I have shown a printing machine 10, e.g. ink jet printer, which can have an ink jet head 11 disposable on an endless table 12 between two pulleys 13 and 14, the latter of which is driven by a motor 15. To detect the position of the ink jet head, one of the pulleys is connected with a pulse generator 16 which can comprise a first plate 17, rotatable with the pulley 13 and a second plate 18 which can be juxtaposed with the first plate and can carry one of the second-plate patterns described hereinafter. The first plate 17 can carry one of the first plate patterns as described. The superimposition of the two plates provides a pattern of the third periodicity which is sensed by a temperature represented by a photo cell 19 receiving transmitting light passing through the plates and derived from a light emitting diode 20. The detector can include a converter 21 outputting a train of pulses 22 which is applied at 23 to control the position of the printing head 11 through control of the motor 15. The plate 18 is angularly adjustable relative to the plate 17 as represented by the arrow 24 but otherwise, like the photo cell 19 is stationary. The plate 17 is rotatable as represented by the arrow back and forth as the head 11 is displaced back and forth across the paper (not shown).

Instead of a rotary movement, a linear removable first plate can be coupled with the cable 12.

Figure 1:
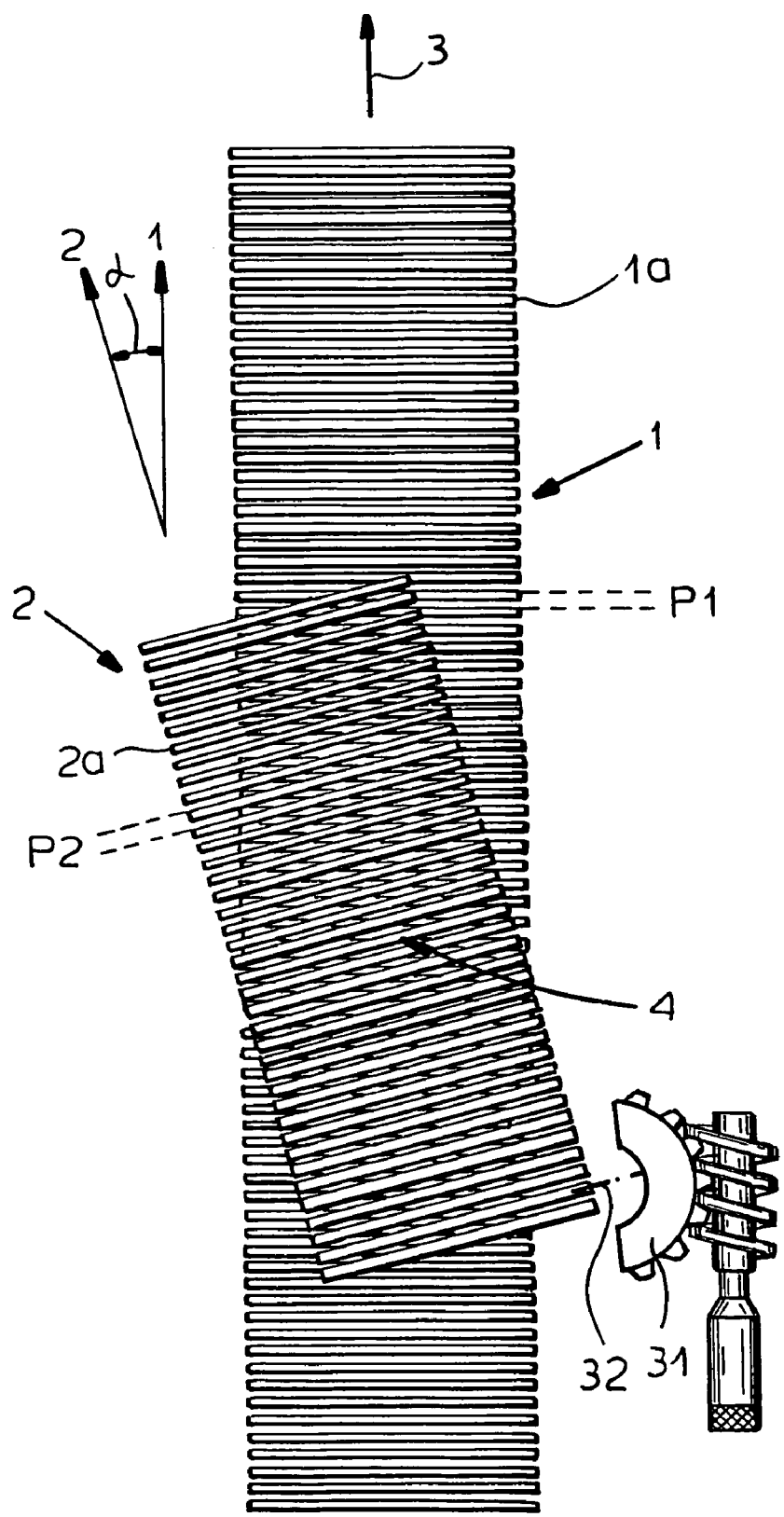
FIG. 1 is a diagram of a pulse generator of the linear type with an adjustable angle between the first and second plates.

In FIG. 1 an embodiment of a pulse generator for linear movement has been illustrated and comprises the first pulse generating plate 1 and a second pulse generator plate 2, the first pulse generating plate 1 being shiftable linearly in the direction of the arrow 3. The pulse-generating plates can be manufactured by conventional techniques and can have transparent carrier material plate structures, which can be provided with a number of mutually parallel streaks 1a with a periodicity P1 for the plate 1.

At angle α to the pulse generating plate 1, a second pulse generating plate 2 is disposed so that it overlaps the first plate in at least one zone. The second pulse generating plate 2 is likewise provided with parallel streaks 2a of a periodicity P2. In the embodiment shown the periodicities P1 and P2 are the same so that at a zero angle α a conventional pulse generator arrangement is provided. However, when the second plate 2 is at an angle α, other than zero, to the plate 1 shown in FIG. 1, in the superimposition zone 4, a Moiré pattern or interference pattern is produced which provides beats between the effective frequencies determined by the periodicities P1 and P2 which is manifested by altering light and dark stripes with a periodicity 3. One such periodicity extends along the half angle α and the other is perpendicular thereto. Either can be the periodicity P3 which is detected. The detection can be effected by a sensor 19 using a light source on the opposite side of the plates (see FIG. 6).

Figure 3:
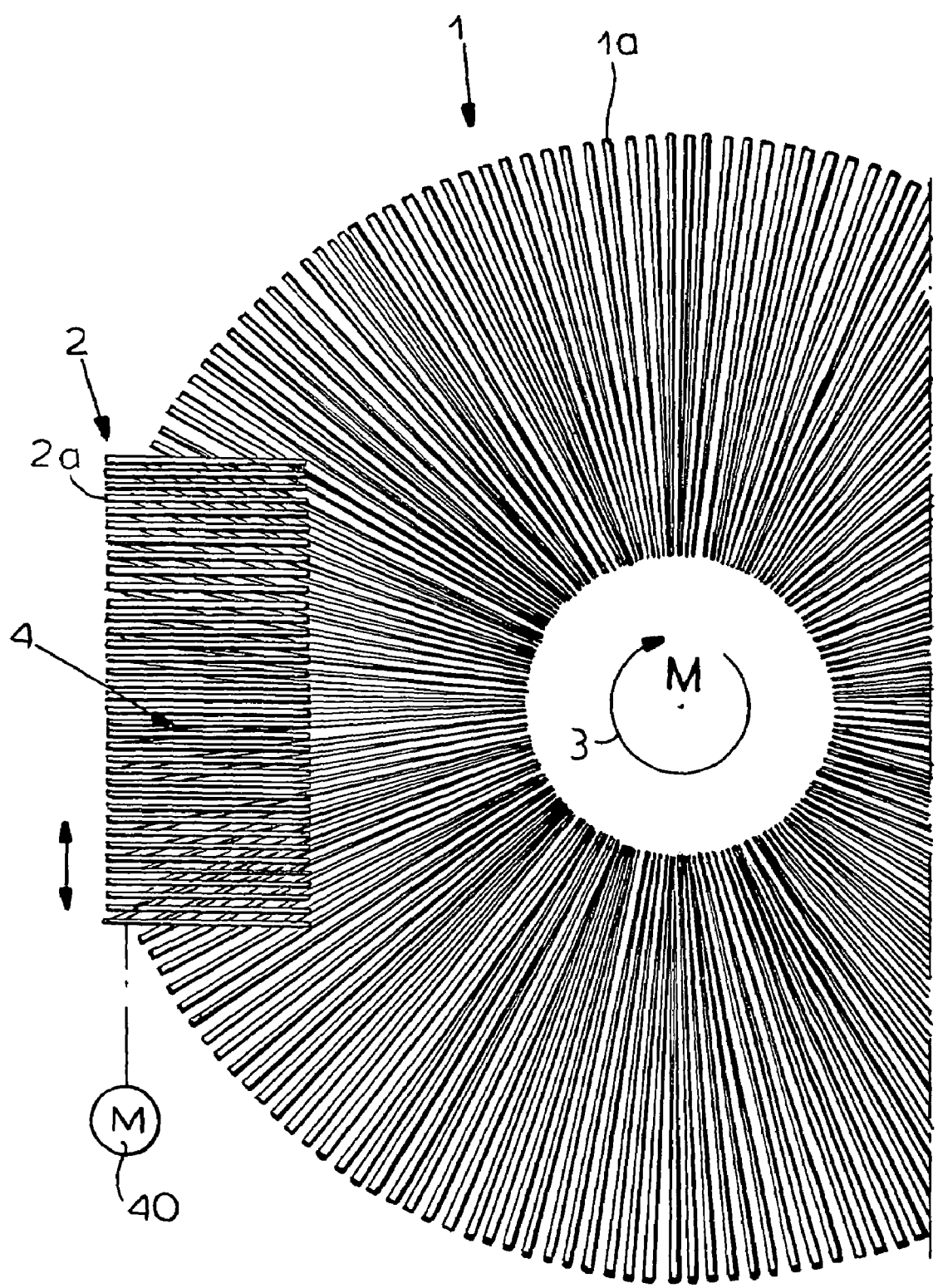
FIG. 3 is a diagram showing a pulse generator for rotatable movement, whereby Moiré and patterns are varied by angular adjustment of one of the plates relative to the other.
Figure 4:
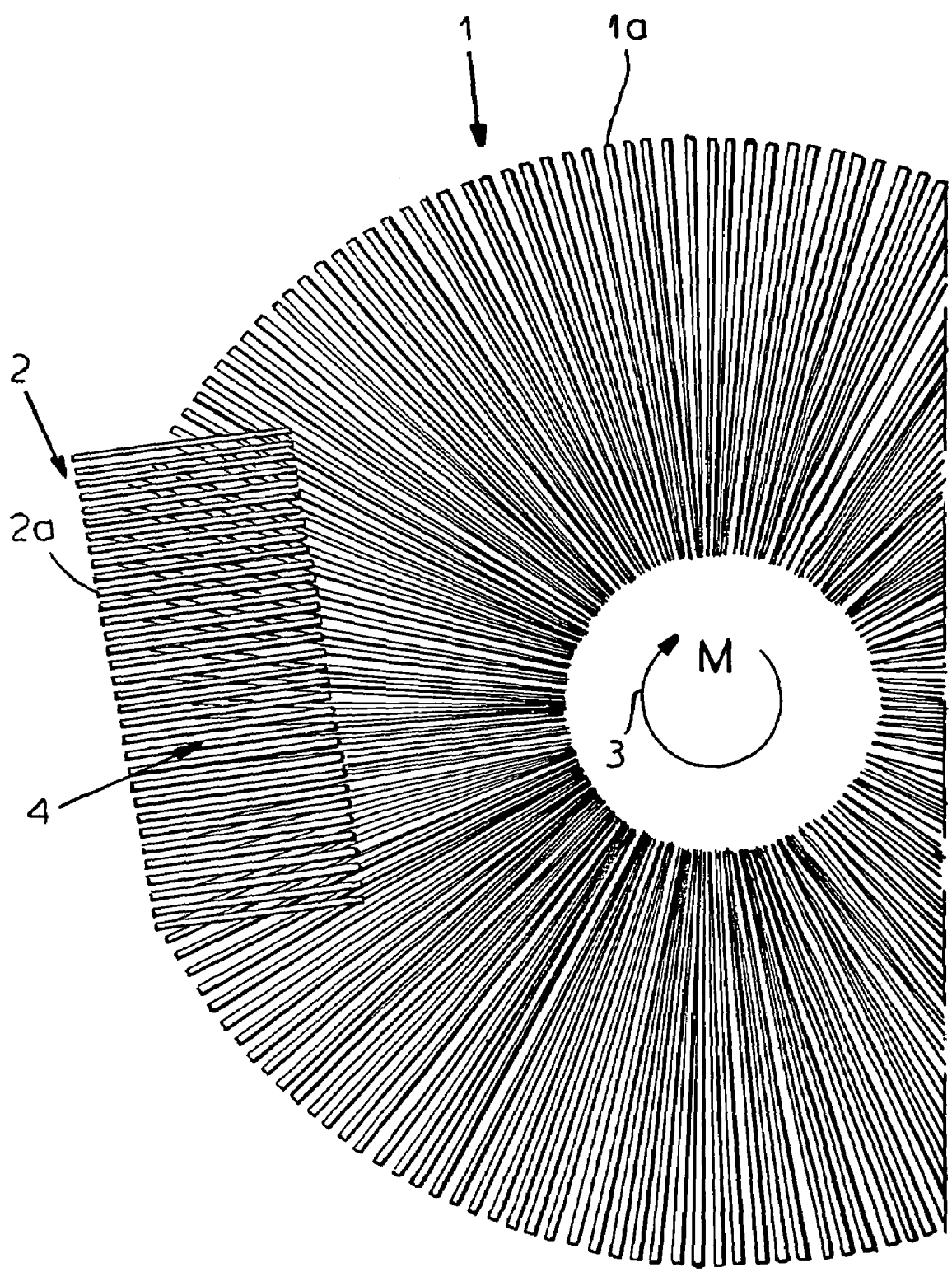
FIG. 4 is a view similar to FIG. 3 but showing a different angular orientation of the second plate.

The periodicity P3 formed by the light-dark stripes or transmissive/opaque stripes, respectively, can be varied by adjusting the angle α as has been shown in FIG. 4 where a greater angle has been selected. The change in the angle can be effected manually, for example, by a micrometer screw 30 as shown in FIG. 1 which engages a pinion 31 coupled at 32 to the angularly displaceable second plate 2, or electrically, for example via a motor 40 such as that shown in FIG. 3 so that the periodicity which is measured by the sensor can be adjusted at will.

In a conventional pulse generator, the pattern is fixed where with the pulse generator of the invention, a Moiré pattern of beats is superimposed upon the frequencies of the patterns of plates 1 and 2 and can permit, by variation of the angle α, an optional pulse count per unit length to be selected. The periodicities of the first and second plates can be equal or approximately equal to produce a particularly intense Moiré effect and in addition the spacing between the plates and thus the grid planes thereof should be held as small as possible to likewise ensure an intense contrast in the Moiré pattern. In fact, the plates may contact each other. The optical sensor is trained on the overlapping region. It will be understood that in accordance with the bead principle the optical signal supplied by the photo cell 19 to the converter 20 will normally be substantially sinusoidal and is converted at 21 into a series of rectangular pulses as has been shown at 22.

It is also possible to subdivide at least one of the pulse generator plates into a plurality of regions in which the arrangements of clear-dark zones of the regions are phase shifted relative to one another. In this manner a plurality of optical sensors trained on the different regions can produce outputs which are similarly phase shifted enabling the direction of movement or rotation to be electronically determined.

Figure 2:
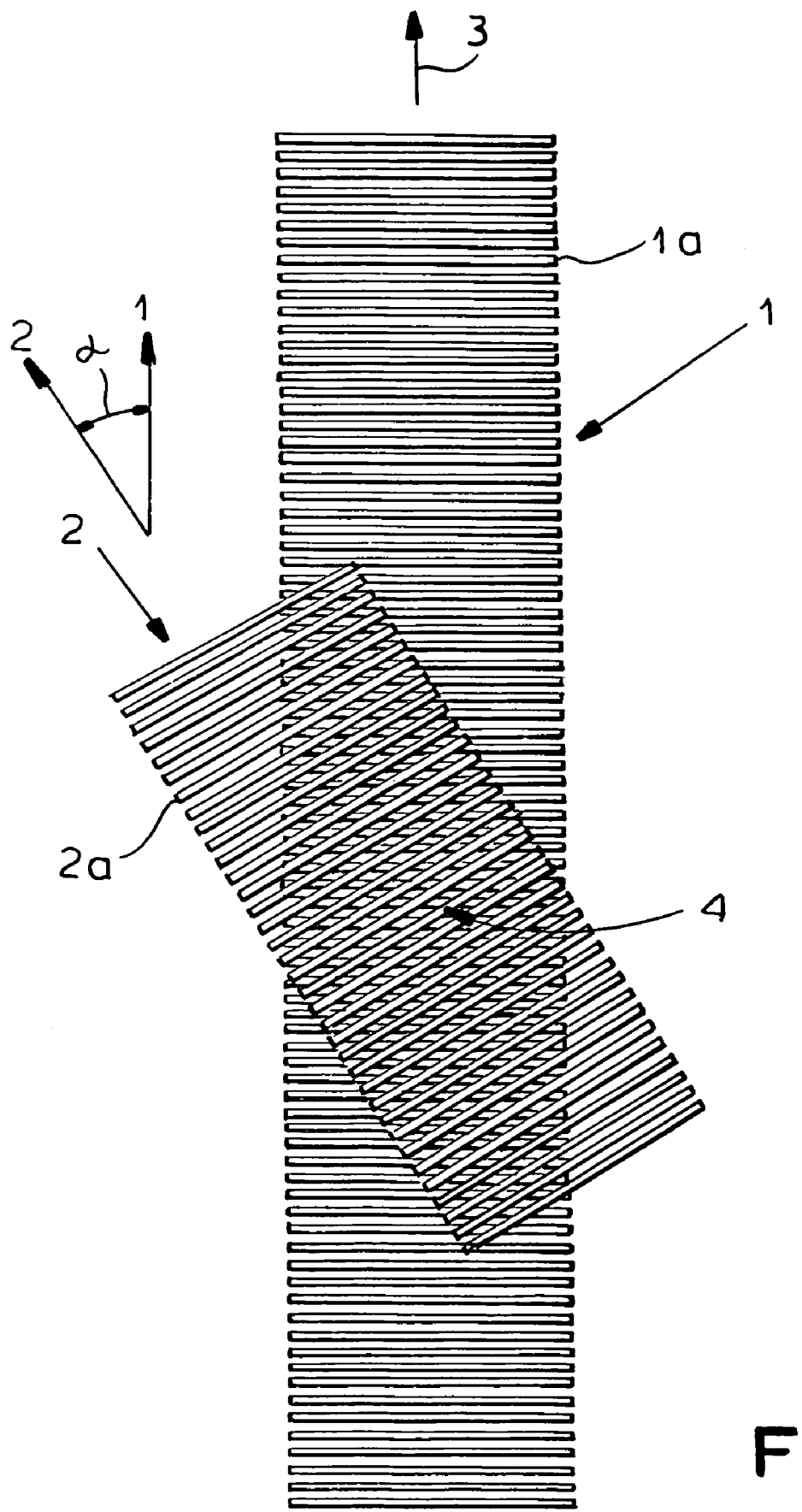
FIG. 2 is a view similar to FIG. 1 showing another relative angular position of the two plates.

FIGS. 3 and 4 show an arrangement of the pulse generator plates for a rotary pulse generator for an encoder. In this case the rotatable pulse generator plate 1 has a multiplicity of radially extending stripes 1a, with a constant angular spacing which defines the periodicity P1 and this plate 1 which rotates about the center point M. The second pulse generator plate, here, as in the embodiment of FIGS. 1 and 2, is formed as a plate with parallel stripes 2a. The pulse generator plate 2 is oriented generally tangential with respect to the plate 1 and in FIG. 3 is shown to be at an angle α of zero degrees to a tangent to the pulse generator plate 1 at the left hand side thereof.

In the overlapping region 4, because the periodicities of the two plates do not coincide, an asymmetrical Moiré is formed with different periodicities in different directions which can be selectively detected by one or more optical sensors in or trained upon the overlapping zone. The second pulse generator plate 2 can be pivoted into another angular position (see FIG. 4) relative to the tangent to the first plate 1 to vary the Moiré pattern and thus the detected periodicity P3.

The rotation of the pulse generating plate 2 into another overlapping angle α can allow a further variation of the outputted electrical signal and permits even nonintegral or mixed numbers of pulses per unit as is highly desirable for matching metric units to inch units as has been described. The beat is readily recognized as patterns of clear and dark stripes which, upon rotation of the round pulse generator to appear to migrate in the direction of rotation, the pivoting of the plate 2 can be effected by providing it with a holder swingable about an axis perpendicular to the planes of the plates 1 and 2 and thus the grid plane, using the motor 4 or the manual means, like the micrometer screw described. The motor can be a servomotor or stepping motor or a piezo element with high resolution, thereby permitting remote control of the output frequency of the pulse generator.

Figure 5:
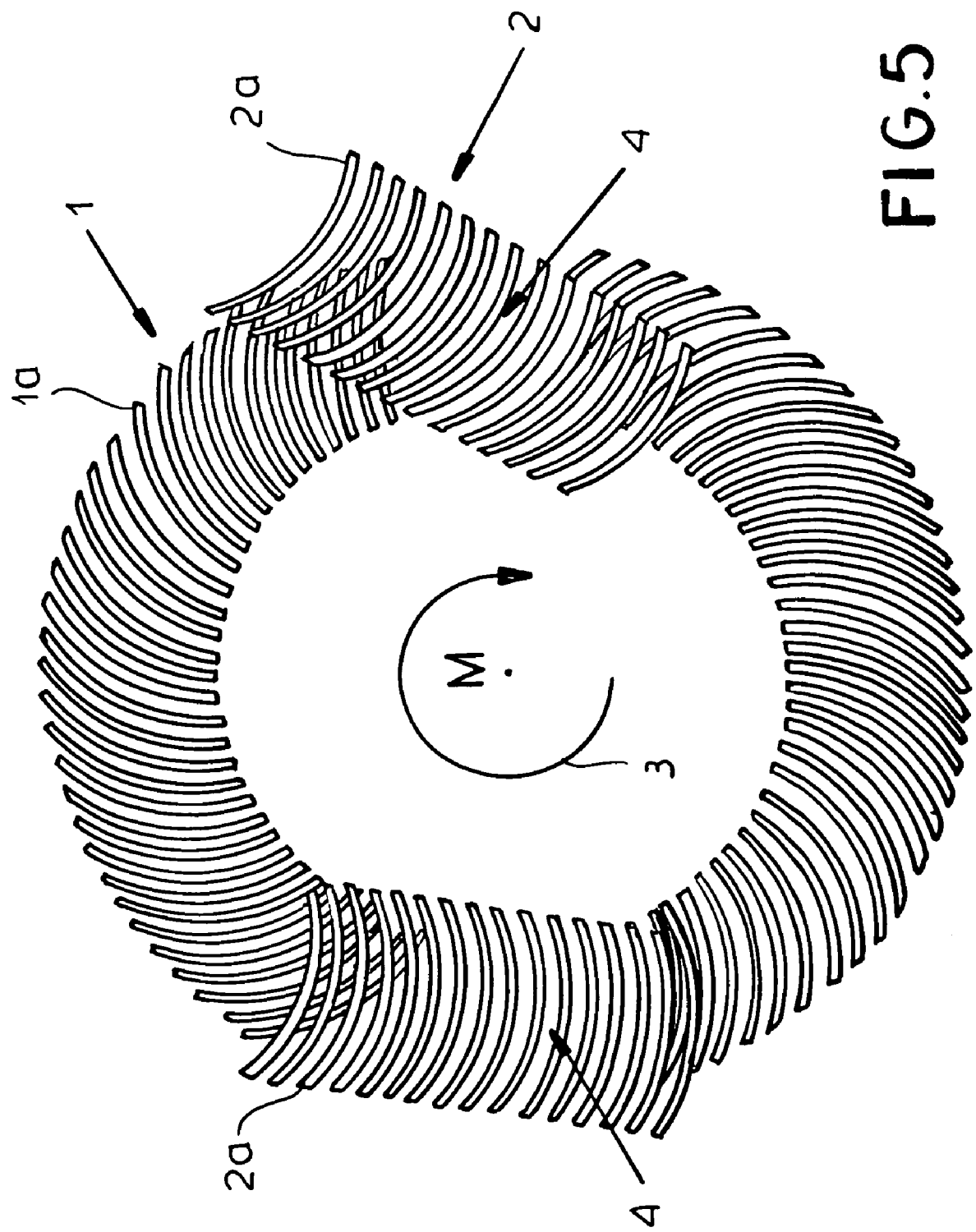
FIG. 5 is yet another diagram of a rotatable pulse generator having two second pulse generator plates but a single first pulse generator plate to generate different numbers of pulses per revolution of the first plate.

As can be seen from FIG. 5, a plurality of second pulse generator plates 2 with respective optical sensors (not shown) can cooperate with a single first pulse generator plate to produce different pulse counts per unit rotation or speed of the rotary member and thus different electrical outputs. Instead of straight stripes or lines, in this embodiment curved stripes or lines 1a, 2a are provided to allow an optimum Moiré pattern to be obtained. The ability to adjust the Moiré pattern to particular applications eliminates the need for mechanical or electronic conversion of the pulse trains which are produced and thus possible precision problems. The system of the invention has been found to be particularly desirable because it permits in a simple way the production of outputs which are difficult to achieve by earlier systems for specific printing resolutions like, for example, 300 pulses per inch, 254 pulses per inch, 120 pulses per inch, etc.

I claim:

1. A pulse generator comprising:
   a first plate having regions of optical characteristics that vary with a first periodicity (P1);
   a second plate having regions of optical characteristics that vary with a second periodicity (P2) juxtaposed with said first plate so that at least in a superimposition zone of the regions with said first and second periodicity, a region is formed with optical characteristics that vary with a third periodicity (P3) that is a function of said first and second periodicities, said third periodicity being a Moiré pattern that is varied by a manual relative shifting of said first and second plates, the optical characteristics being selected from optical density, reflectivity, and transmissivity; and
   an optical sensor positioned to detect the periodically different optical characteristics of said third periodicity and to generate an electric signal corresponding to the detected periodically different optical characteristics of said third periodicity.

2. The pulse generator defined in claim 1 wherein the first and second plates are so juxtaposed in said superimposition zone as to generate a Moiré pattern with at least one third periodicity detectable by said optical sensor.

3. The pulse generator defined in claim 1 wherein at least one of said plates is movable relative to the other plate and said optical sensor.

4. The pulse generator defined in claim 3 wherein said one of said plates is movable linearly with respect to said other plate and said optical sensor.

5. The pulse generator defined in claim 3 wherein said one of said plates is movable rotatably with respect to said other plate and said optical sensor.

6. The pulse generator defined in claim 1 wherein one of said plates is a linearly movable plate having regions of periodically different optical characteristics with a respective periodicity extending linearly and parallel to one another at a given spacing transverse to a direction of movement of said one of said plates.

7. The pulse generator defined in claim 1 wherein one of said plates is a rotatable plate having regions of periodically different optical characteristics with a respective periodicity extending linearly or curvilinearly and angularly equispaced about a center of rotation of said rotatable plate.

8. The pulse generator defined in claim 7 wherein said regions of periodically different optical characteristics of said rotatable plate are radial lines.

9. The pulse generator defined in claim 7 wherein said regions of periodically different optical characteristics of said rotatable plate are curved lines.

10. The pulse generator defined in claim 1 wherein said regions of periodically different optical characteristics are lines spaced apart upon a transparent support.

11. The pulse generator defined in claim 1 wherein the relative shifting is a change in an angle ($\alpha$) between said plates.

12. The pulse generator defined in claim 1, further comprising a micrometer screw operating on one of said plates to effect manual relative shifting of said plates.

13. The pulse generator defined in claim 1, further comprising
an electric motor coupled to one of said plates to effect relative shifting of said plates.

14. The pulse generator defined in claim 1 wherein a plurality of said second plates and a plurality of optical sensors are juxtaposed with said first plate and at different angles therewith.

* * * * *

UNITED STATES PATENT AND TRADEMARK OFFICE
CERTIFICATE OF CORRECTION

PATENT NO.       : 7,214,930 B2                                              Page 1 of 1
APPLICATION NO.  : 10/976339
DATED            : May 8, 2007
INVENTOR(S)      : Peter Schmitt It is certified that error appears in the above-identified patent and that said Letters Patent is hereby corrected as shown below:

Title Pg. Item (73) Assignee:
– Assignee's city should be spelled: VEITS<u>HOCH</u>HEIM Signed and Sealed this Twenty-sixth Day of August, 2008

JON W. DUDAS
*Director of the United States Patent and Trademark Office*